(12) United States Patent
Liu et al.

(10) Patent No.: US 10,705,641 B2
(45) Date of Patent: Jul. 7, 2020

(54) SENSING PANEL, AND DISPLAY DEVICE AND DRIVING METHOD THEREOF

(71) Applicant: BOE TECHNOLOGY GROUP CO., LTD., Beijing (CN)

(72) Inventors: Yingming Liu, Beijing (CN); Xue Dong, Beijing (CN); Haisheng Wang, Beijing (CN); Xiaoliang Ding, Beijing (CN); Rui Xu, Beijing (CN); Changfeng Li, Beijing (CN); Liguang Deng, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 49 days.

(21) Appl. No.: 15/982,261

(22) Filed: May 17, 2018

(65) Prior Publication Data
US 2019/0079628 A1 Mar. 14, 2019

(30) Foreign Application Priority Data
Sep. 8, 2017 (CN) .......................... 2017 1 0807058

(51) Int. Cl.
*G06F 3/041* (2006.01)
*G06K 9/00* (2006.01)
(Continued)

(52) U.S. Cl.
CPC ............ *G06F 3/0414* (2013.01); *G06F 3/042* (2013.01); *G06F 3/04144* (2019.05);
(Continued)

(58) Field of Classification Search
CPC ............ G06F 3/0414; G06F 3/04144; G06F 3/041661; G06F 3/042; G06F 2203/04106;
(Continued)

(56) References Cited

U.S. PATENT DOCUMENTS 7,196,307 B2 *  3/2007  Ozawa ................. G09G 3/3648
                                                    250/208.2
9,870,100 B2 *  1/2018  Yi .......................... G06F 3/0425
(Continued)

FOREIGN PATENT DOCUMENTS

CN   105335004 A   2/2016
CN   106446871 A   2/2017

OTHER PUBLICATIONS

Office Action dated Nov. 27, 2019 issued in corresponding to Chinese Application No. 201710807058.0.

*Primary Examiner* — Stacy Khoo
(74) *Attorney, Agent, or Firm* — Nath, Goldberg & Meyer; Joshua B. Goldberg

(57) ABSTRACT

The present application discloses a sensing panel, and a display device and a driving method thereof. The sensing includes a base substrate; a plurality of photosensitive units arranged in an array on the base substrate; and a plurality of pressure-sensitive units arranged in an array on the base substrate. The photosensitive units and the pressure-sensitive units are integrated in a same sensing panel, and are stacked and share a fixed-potential electrode. As such, after loading a fixed potential to the fixed-potential electrode, the pressure detection and the touch detection can be achieved simultaneously with the same sensing panel.

20 Claims, 5 Drawing Sheets

(51) Int. Cl.
*H01L 29/417* (2006.01)
*G09G 3/20* (2006.01)
*G06F 3/042* (2006.01)

(52) U.S. Cl.
CPC ..... *G06F 3/041661* (2019.05); *G06K 9/0004* (2013.01); *G09G 3/20* (2013.01); *H01L 29/41775* (2013.01); *G06F 3/0412* (2013.01); *G06F 2203/04106* (2013.01)

(58) Field of Classification Search
CPC ...... G06F 3/0412; G06K 9/0004; G09G 3/20; H01L 29/41775
See application file for complete search history.

(56) References Cited

U.S. PATENT DOCUMENTS

| | | | |
|---|---|---|---|
| 10,162,462 B2* | 12/2018 | Shen | G06F 3/0416 |
| 10,222,899 B2 | 3/2019 | Cao | |
| 2016/0132712 A1* | 5/2016 | Yang | G06K 9/0002 348/77 |
| 2017/0221925 A1* | 8/2017 | Lou | H01L 27/127 |
| 2017/0285789 A1* | 10/2017 | Barel | G06F 3/0412 |
| 2018/0239941 A1* | 8/2018 | MacKey | G06K 9/0004 |

* cited by examiner

SENSING PANEL, AND DISPLAY DEVICE AND DRIVING METHOD THEREOF

CROSS-REFERENCE TO RELATED APPLICATION

The present application claims priority of the Chinese Patent Application No. 201710807058.0 filed on Sep. 8, 2017, the contents of which are incorporated herein in their entirety by reference.

TECHNICAL FIELD

The present application relates to the field of display technology, and particularly relates to a sensing panel, a display device and a driving method for the display device.

BACKGROUND

Pressure-sensitive technology refers to the technology with which the external force can be detected, and this technology has been widely used in the industrial control field, the medical field and so on. At present, the way to achieve the pressure-sensitive in the display field (especially in the field of mobile phone or tablet) is to add an additional mechanism to the backlight part of the display panel or the middle frame part of the mobile phone. However, this design needs to change the structure design of the display panel or the mobile phone, and the detection accuracy of the design is also limited because of a large assembly tolerance.

SUMMARY

The disclosure provides a sensing panel, comprising:
a base substrate;
a plurality of photosensitive units arranged in an array on the base substrate; and
a plurality of pressure-sensitive units arranged in an array on the base substrate;
wherein the plurality of photosensitive units and the plurality of pressure-sensitive units are stacked, and at least one of the plurality of photosensitive units and at least one of the plurality of pressure-sensitive units, which are stacked, share a fixed-potential electrode.

In some embodiments, the plurality of pressure-sensitive units are located on a side of the plurality of photosensitive units opposite to the base substrate; and
a region of each of the plurality of pressure-sensitive units which at least overlaps with an orthographic projection of a photosensitive region of one corresponding photosensitive unit of the plurality of photosensitive units on the base substrate is a light transmittance region.

In some embodiments, each of the plurality of pressure-sensitive units comprises an independent piezoelectric material layer connected to the fixed-potential electrode, and an independent pressure-sensitive electrode connected to the piezoelectric material layer.

In some embodiments, each of the plurality of photosensitive units comprises a light-sensitive diode and a switching transistor;
one end of the light-sensitive diode is connected to the fixed-potential electrode and the other end of the light-sensitive diode is connected to a first electrode of the switching transistor; and
a second electrode of the switching transistor is connected to a read line, and a control electrode of the switching transistor is connected to a scan line.

In some embodiments, the switching transistor is a bottom-gate transistor; and
each of the plurality of photosensitive units further comprises a metal light blocking layer which is arranged between the bottom-gate transistor and the pressure-sensitive unit, and an orthographic projection of the metal light blocking layer on the base substrate covers at least an orthographic projection of a channel region of the bottom-gate transistor on the base substrate.

In some embodiments, the orthographic projection of the metal light blocking layer on the base substrate further covers an orthographic projection of the read line on the base substrate, and the metal light blocking layer is grounded.

In some embodiments, each of the plurality of photosensitive units is a fingerprint recognition unit; and
an orthographic projection of one of the plurality of pressure-sensitive units on the base substrate covers orthographic projections of a plurality of fingerprint recognition units, and the plurality of fingerprint recognition units constitute one touch recognition unit.

The disclosure further provides a display device comprising a sensing panel, the sensing panel comprises:
a base substrate;
a plurality of photosensitive units arranged in an array on the base substrate; and
a plurality of pressure-sensitive units arranged in an array on the base substrate;
wherein the plurality of photosensitive units and the plurality of pressure-sensitive units are stacked, and at least one of the plurality of photosensitive units and at least one of the plurality of pressure-sensitive units, which are stacked, share a fixed-potential electrode.

In some embodiments, the display device further comprises a display panel arranged on the sensing panel.

In some embodiments, the display device further comprises a light collimation device arranged between the sensing panel and the display panel.

In some embodiments, the display device further comprises a plurality of display units arranged in an array on the base substrate.

In some embodiments, the disclosure provides a driving method for a display device, which comprises a sensing panel, the sensing panel includes:
a base substrate;
a plurality of photosensitive units arranged in an array on the base substrate; and
a plurality of pressure-sensitive units arranged in an array on the base substrate;
wherein the plurality of photosensitive units and the plurality of pressure-sensitive units are stacked, and at least one of the plurality of photosensitive units and at least one of the plurality of pressure-sensitive units, which are stacked, share a fixed-potential electrode;
the driving method includes:
loading a fixed potential to the fixed-potential electrode;
detecting first electrical signals output by the plurality of photosensitive units to determine a touch position; and
detecting second electrical signals output by the plurality of pressure-sensitive units to determine a press position.

In some embodiments, when the plurality of photosensitive units act as fingerprint recognition units, the driving method particularly comprises:
loading the fixed potential to the fixed-potential electrode when the display device is in a black screen state;
detecting the second electrical signals output by the plurality of pressure-sensitive units to determine the press position where a finger pressed;

lightening the press position;

detecting the first electrical signals output by the fingerprint recognition units at the press position to obtain a pressed fingerprint; and causing the display device to be in a display state upon determining that the pressed fingerprint matches the preset fingerprint.

In some embodiments, after determining the press position, the driving method further comprises:

determining whether a pressure degree corresponding to a second electrical signal output by at least one of the pressure-sensitive unit at the press position is greater than a threshold; and lightening the press position upon determining that the pressure degree corresponding to the second electrical signal is greater than the threshold.

In some embodiments, the plurality of fingerprint recognition units covered by an orthographic projection of one of the plurality of pressure-sensitive units on the base substrate constitute one touch recognition unit, and wherein the step of detecting electrical signals output by the plurality of photosensitive units to determine a touch position includes:

resetting each of the plurality of touch recognition units; and detecting the first electrical signal output by each of the plurality of touch recognition units to determine the touch position.

DETAIL DESCRIPTION OF EMBODIMENTS

Figure 1:
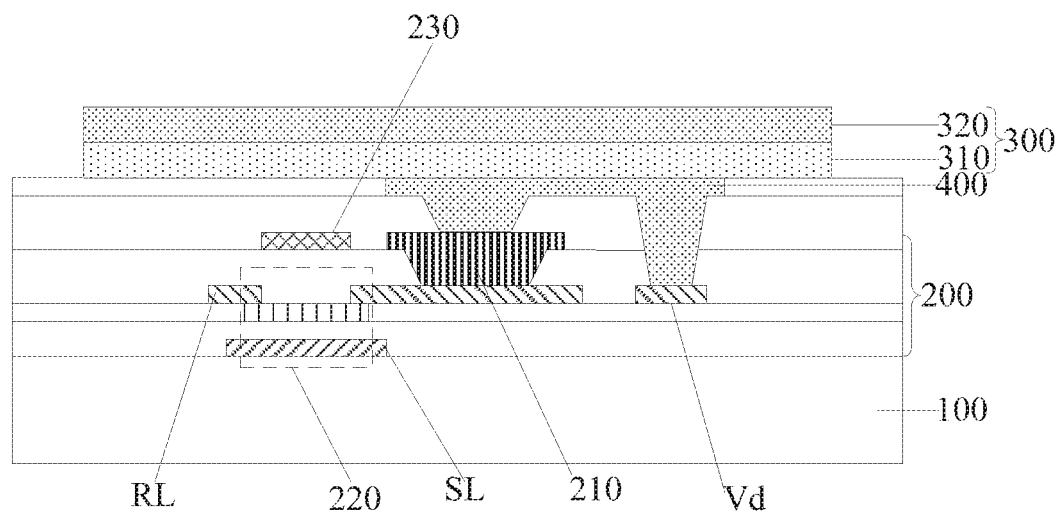
FIGS. 1 to 3 are schematic views of structures of sensing panels according to embodiments of the present application, respectively.

Next, embodiments of the sensing panel, the display device and its driving method according to the present application are described in detail in combination with the drawings.

The shapes and sizes of the components in the drawings do not reflect the true scale of the sensing panel and the display device, and are intended for illustrating the contents of this application.

This application solves the problem of how to achieve the pressure-sensitive with high detection accuracy with less change in the hardware of the display panel.

One embodiment of the present application provides a sensing panel, as shown in FIG. 1, comprising: a base substrate 100, a plurality of photosensitive units 200 arranged in an array on the base substrate 100, and a plurality of pressure-sensitive units 300 arranged in an array on the base substrate 100.

In the embodiment shown in FIG. 1, the photosensitive unit 200 and the pressure-sensitive unit 300 are stacked, and the photosensitive unit 200 and the pressure-sensitive unit 300, which are stacked, share a fixed-potential electrode 400.

Specifically, in the aforementioned sensing panel according to this embodiment, both the photosensitive unit 200 and the pressure-sensitive unit 300 can be integrated in a same sensing panel, and the photosensitive unit 200 and the press-sensitive unit 300 are stacked to share a fixed-potential electrode 400. The working principle of the pressure-sensitive unit 300 is different from that of the photosensitive unit 200: the pressure-sensitive unit 300 converts a pressure into an electrical signal, and the photosensitive unit 200 converts an optical signal to an electrical signal. In this way, after a fixed potential is applied to the fixed-potential electrode 400, functions of both pressure-sensitive and touch sensing can be achieved with the same sensing panel by detecting the electrical signal output by the pressure-sensitive unit 300 and the electrical signal output by the photosensitive unit 200, respectively. The sensing panel according to the embodiment is easy to be integrated in the display device, and can achieve the functions of pressure-sensitive and touch detection with high accuracy with less change to the display device.

Figure 2:
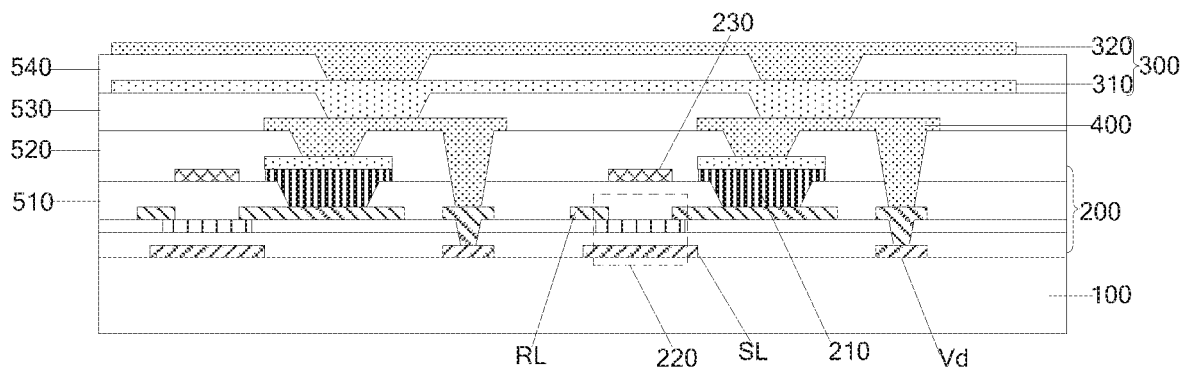

Optionally, in the sensing panel provided by embodiments of the present application, as shown in FIG. 2, each light sensing unit 200 may be a fingerprint recognition unit. Correspondingly, an orthographic projection of one pressure-sensitive unit 300 on the base substrate 100 should cover an orthographic projection of a plurality of fingerprint recognition units on the base substrate 100.

Specifically, in the aforementioned sensing panel according to embodiments of the present application, besides the functions of pressure-sensitive and touch detection, the fingerprint recognition function can be achieved. With the fingerprint recognition function, a fingerprint scan region can be detected by using the pressure-sensitive unit 300 before the fingerprint recognition is performed, which can obtain the effective detection regions of the fingerprint, thus preventing the mis-operation from occurring. Since the precision required to achieve the fingerprint recognition is much higher than the precision required to achieve the functions of pressure-sensitive and touch detection, in order to achieve the fingerprint recognition function, the size of each fingerprint recognition unit (that is, the photosensitive unit 200) needs to be in the micron magnitude, and the size of the pressure-sensitive unit 300 is generally in the millimeter magnitude. In this way, when the fingerprint recognition function is needed, each pressure-sensitive unit 300 covers a plurality of fingerprint recognition units, and one pressure-sensitive unit 300 shares the fixed-potential electrode 400 with the plurality of fingerprint recognition units covered by the pressure-sensitive unit 300.

Optionally, in the aforementioned sensing panel provided by embodiments of the present application, as shown in FIG. 1 and FIG. 2, each pressure-sensitive unit 300 may be located on one side of the photosensitive unit 200 opposite to the base substrate 100; a region of each pressure-sensitive unit 300 which at least overlaps with an orthographic projection of the photosensitive region of each photosensitive unit 200 on the base is a light transmittance region. Of course, each pressure-sensitive unit 300 can also be located on one side of the photosensitive unit 200 facing the base substrate 100. That is, the pressure-sensitive unit 300 is arranged between the photosensitive unit 200 and the base substrate 100, which is not limited herein.

Specifically, in the aforementioned sensing panel according to embodiments of the present application, the pressure-sensitive unit 30X) is arranged above the photosensitive unit 200, and the pressure-sensitive unit 300 is closer to a sensing surface (a surface contacting an operator's finger) of the sensing panel than the photosensitive unit 200, so that the detection of the pressure is more sensitive. The working principle of the photosensitive unit 200 for fingerprint detection is that light reflected back by the fingerprint is received to generate a light current. Because of the different light intensity reflected by valley or ridge, the generated light current will be different, thus achieving the function of recognizing of the valley or ridge of the fingerprint. Similarly, the working principle of the photosensitive unit 200 for touch detection is in that different light current is generated based on the different light reflected by the touch position and other non-touch positions to achieve the touch detection. In order to make the pressure-sensitive unit 300 above the photosensitive unit 200 not affect the photosensitive characteristics of the photosensitive unit 200, it is necessary to set a region of each pressure-sensitive unit 300 that at least overlaps with the photosensitive region of each photosensitive unit 200 as a light transmittance region.

Generally, in order to facilitate manufacturing, all pressure-sensitive units 300 can be made of a light transmittance material. However, when the sensing panel is integrated in the display device, there is a far distance between the fingerprint to be recognized and the photosensitive area of the photosensitive unit 200 (for example, about 1 mm), which causes the light reflected by the valley and ridge in the fingerprint to come simultaneously into the same photosensitive unit 200, and causes a light mixing problem, disturbing recognizing of the fingerprint, such that it is difficult to obtain a fingerprint with high definition. Based on this, a region of each pressure-sensitive unit 300 that only overlaps with the photosensitive region of each photosensitive unit 200 can be set as a light transmittance region, and the other regions are shading regions, so that the filtering function of the light-angle of the fingerprint can be achieved in the pressure-sensitive unit 300, which ensures that the light reflected by the valley and ridge in the fingerprint cannot cause light mixing in the photosensitive unit 200, thereby recognizing the fingerprint with high definition, to facilitate the integration of the photosensitive panel and the display panel.

Optionally, in the aforementioned sensing panel provided by embodiments of the present application, as shown in FIG. 1 and FIG. 2, each pressure-sensitive unit 300 may also include a piezoelectric material layer 310 connected to the fixed-potential electrode 400 and a pressure-sensitive electrode 320 connected to the piezoelectric material layer 310;

The piezoelectric material layers 310 of the pressure-sensitive units 300 are independent of each other.

The pressure-sensitive electrodes 320 of each pressure-sensitive units 300 are independent of each other.

Specifically, in the aforementioned sensing panel according to embodiments of the present application, in order to facilitate the pressure detection by each pressure-sensitive unit 300, the pressure-sensitive electrodes 320 of all the pressure-sensitive units 300 should be insulated from each other. The piezoelectric material layers 310 of all the pressure-sensitive units 300 may be insulated from each other, or may be connected to each other (i.e., all the piezoelectric material layers 310 are provided as a whole layer). The piezoelectric material layer 310 may be made of Polyvinylidene Fluoride (PVDF) material. When the piezoelectric material layer 310 of each pressure-sensitive unit 300 is independent, the sensitivity of the pressure detection can be improved, and the piezoelectric material layer 310 of each pressure-sensitive unit 300 may have a same pattern as that of the pressure-sensitive electrode 320, so that a same mask plate may be used to prepare the piezoelectric material layer 310 and the pressure-sensitive electrodes 320 without increase in manufacturing cost. The size of the pressure-sensitive unit 300 is generally matched with the size of the finger, for example, each pressure-sensitive unit 300 can be set to be of 5*5 mm.

Specifically, in the aforementioned sensing panel according to embodiments of the present application, when the pressure-sensitive unit 300 is arranged above the photosensitive unit 200, in order to facilitate sharing of the fixed-potential electrode 400 between the pressure sensitive unit 300 and the lower photosensitive unit 200, the fixed-potential electrode 400 is generally arranged between the pressure sensitive unit 300 and the photosensitive unit 200. Moreover, the fixed-potential electrodes 400 connected to the photosensitive units 200 may be independent of each other, or connected to each other. As shown in FIG. 1, the fixed-potential electrode 400 may contact directly the piezoelectric material layer 310, or may be connected to the piezoelectric material layer 310 by a via passing through a first insulating layer 530 between the fixed-potential electrode 400 and the piezoelectric material layer 310, as shown in FIG. 2. The piezoelectric material layer 310 may contact directly the pressure-sensitive electrode 320 as shown in FIG. 1, or may be connected to the pressure-sensitive electrode 320 by a via in a second insulating layer 540 between the piezoelectric material layer 310 and the pressure-sensitive electrode 320, as shown in FIG. 2, which is not limited herein.

Optionally, in the above sensing panel provided by the embodiments of the present application, as shown in FIGS. 1 and 2, each photosensitive unit 200 may include a light-sensitive diode 210 and a switching transistor 220; and one end of the light-sensitive diode 210 is connected to the fixed-potential electrode 400 and the other end is connected to a first electrode (source or drain) of the switching transistor 220; and a second electrode (drain or source) of the switching transistor 220 is connected to a read line RL, and a control electrode (gate) is connected to a scan line SL.

Specifically, in the above sensing panel according to the embodiment of the present application, the light-sensitive diode 210 is used as a photosensitive region of the photosensitive unit 200, above which should be a light transmittance region. Therefore, the fixed-potential electrode 400 should be made of a transparent conductive material, and the light-sensitive diode 210 is usually provided above the switching transistor 220 to prevent the switching transistor 220 from blocking the light-sensitive diode 210.

Specifically, in the above sensing panel according to the embodiment of the present application, the read line RL is generally made in a same layer as the source/drain of the switching transistor 220, such that a light current generated by the light-sensitive diode 210 is output when the switching transistor 220 is turned on; the scan line SL is generally made in the same layer as the gate of the switching transistor 220. In addition, in order to load a fixed potential to the fixed-potential electrode 400, a fixed potential signal line Vd is required to be provided, and the fixed potential signal line Vd may be made in the same layer as the scan line SL, as shown in FIG. 2, or made in the same layer as the read line RL, as shown in FIG. 1, which is not limited herein.

Optionally, in the above sensing panel provided by the embodiment of the present application, as shown in FIGS. 1 and 2, the switching transistor 220 may be a bottom-gate transistor, that is, an active layer of the switching transistor 220 is provided above the gate. Now, in order to avoid that photon-generated carriers are produced due to the fact that the above light irradiates on a channel region of the switching transistor 220 to generate a leakage current, each photosensitive unit 200 may further comprise a metal light blocking layer 230 arranged between the bottom-gate transistor and the pressure-sensitive unit 300, and the orthographic projection of the metal light blocking layer 230 on the base substrate 100 covers at least the orthographic projection of the channel region of the bottom-gate transistor on the base substrate 100.

Specifically, in the above sensing panel according to the embodiment of the present application, as shown in FIG. 2, a third insulating layer 510 may be arranged between the metal light blocking layer 230 and the channel region of the bottom-gate transistor to prevent the metal light blocking layer 230 and the channel region of the bottom gate transistor from being electrically connected to each other. A planarization layer 520 may further be arranged between the metal light blocking layer 230 and the fixed-potential electrode 400 to prevent the metal light blocking layer 230 and the fixed-potential electrode 400 from being electrically connected to each other.

Figure 3:
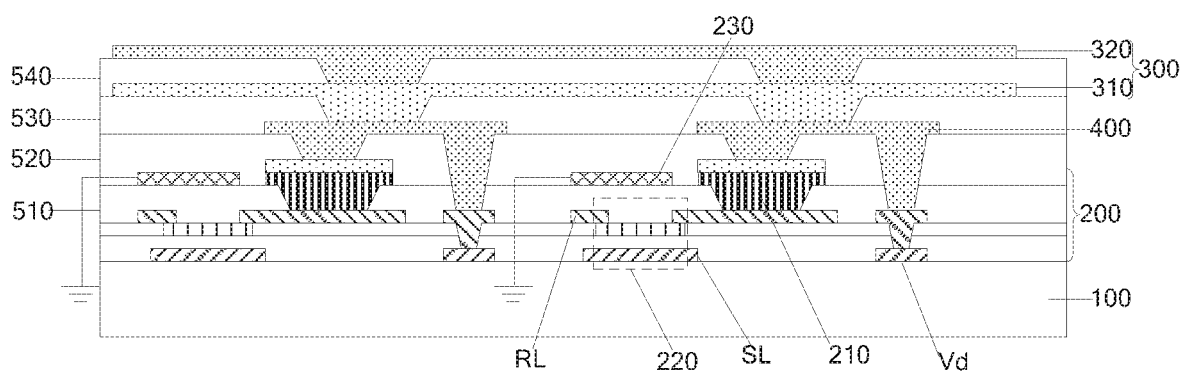

Optionally, in the above sensing panel provided by the embodiment of the present application, as shown in FIG. 3, the orthographic projection of the metal shading layer 230 on the base substrate 100 may also cover the orthographic projection of the read line RL on the base substrate 100, and the metal blocking layer 230 may be grounded.

Specifically, in the above sensing panel according to the embodiment of the present application, the grounded metal blocking layer 230 functions as a shielding electrode, and may isolate signals between the read line RL and the pressure-sensitive electrode 320 such that the touch detection and the pressure detection do not impact each other when they are performed simultaneously, which will help to improve precision of both the touch detection and the pressure detection.

Another embodiment of the present application provides a display device, which includes the above sensing panel provided by the embodiment of the present application, and the detailed description for the sensing panel may refer to the above embodiments and is not repeated. The display device may be any product or part with a display function such as a cell phone, a tablet, TV, a display, a laptop computer, a digital photo frame, and a navigator.

Figure 4:
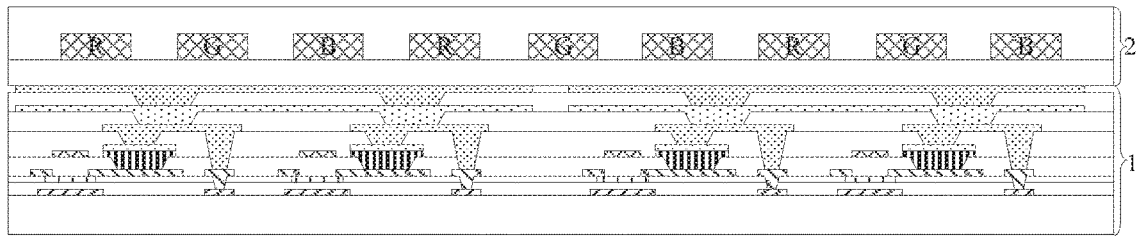
FIGS. 4 to 6 are schematic views of structures of display devices according to embodiments of the present application, respectively.

Optionally, the above display device provided by the embodiment of the present application, as shown in FIG. 4, may also include a display panel 2 arranged on the sensing panel 1.

Specifically, in the above sensing panel according to the embodiment of the present application, the display panel 2 may be provided above the sensing panel 1. The display panel and the sensing panel 1 may be prepared individually, and then assembled to form the display device. The light emitted by the display panel irradiates on the fingerprint, and then, the light reflected by the valley and the ridge of the fingerprint passes through a gap of the display panel into the photosensitive unit 200 of the sensing panel 1 for recognizing.

Figure 5:
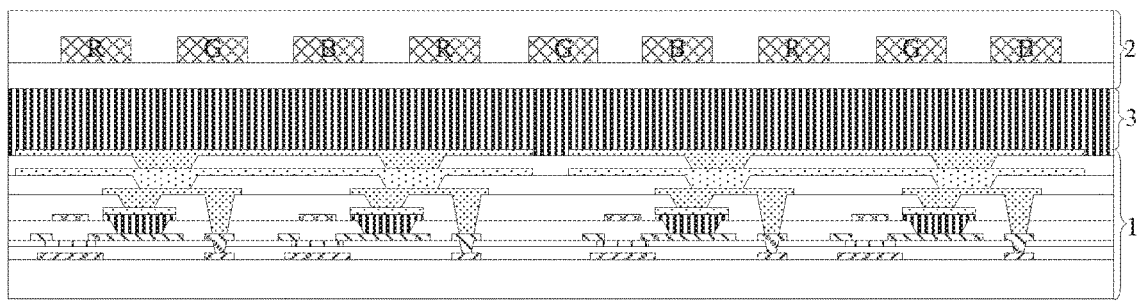

Optionally, the above display device provided by the embodiment of the present application, as shown in FIG. 5, may further include a light collimation device 3 arranged between the sensing panel 1 and the display panel 2.

Specifically, in the above sensing panel according to the embodiment of the present application, the light collimation device 3 may filter light paths for the light reflected by the valley and the ridge of the fingerprint passing through the gap of the display panel 2 to ensure that the light reflected by the valley and the ridge of the fingerprint may not mix in light sensing unit 200, thereby recognizing the fingerprint with a higher definition, which will help the integration of the sensing panel 1 and the display panel 2.

Figure 6:
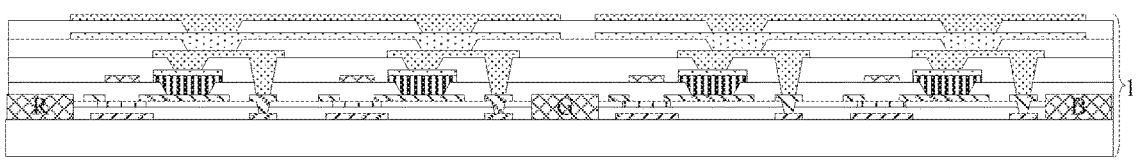

Optionally, the above display device provided by the embodiment of the present application, as shown in FIG. 6, may further include display units R, G and B which are arranged in an array on the base substrate of the sensing panel 1.

Specifically, in the above sensing panel according to the embodiment of the present application, the sensing panel 1 and the display panel 2 may be integrated, and the display units R, G and B are arranged between the photosensitive units 200, which can achieve an ultra-thin design of the display device.

Figure 7:
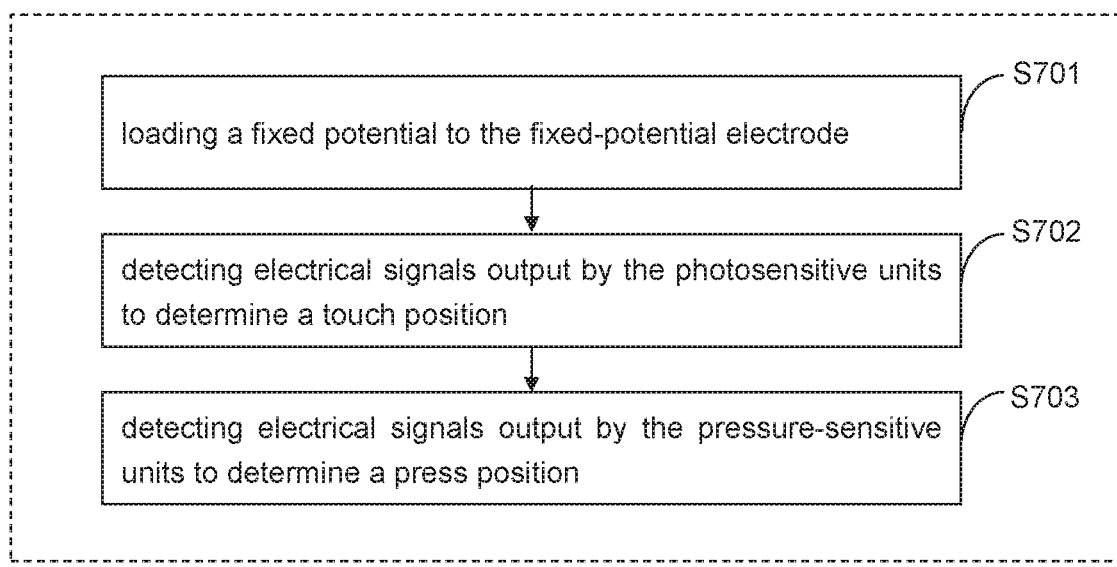
FIGS. 7 to 9 are flowcharts illustrating driving methods for the display device according to embodiments of the present application, respectively.

Another embodiment of the present application further provides a driving method for the above display device, as shown in FIG. 7, which may include the following steps:

at step S701, loading a fixed potential to the fixed-potential electrode;

at step S702, detecting electrical signals output by all the photosensitive units to determine a touch position; and at step S703, detecting electrical signals output by all the pressure-sensitive units to determine a press position.

Specifically, in the above driving method provided by the embodiment of the present application, during the display process, the pressure detection and the touch detection may be performed simultaneously, or may be performed in a time-sharing manner, that is, the steps S702 and S703 may be performed simultaneously, or performed in a time-sharing manner, which is not limited herein.

Figure 8:
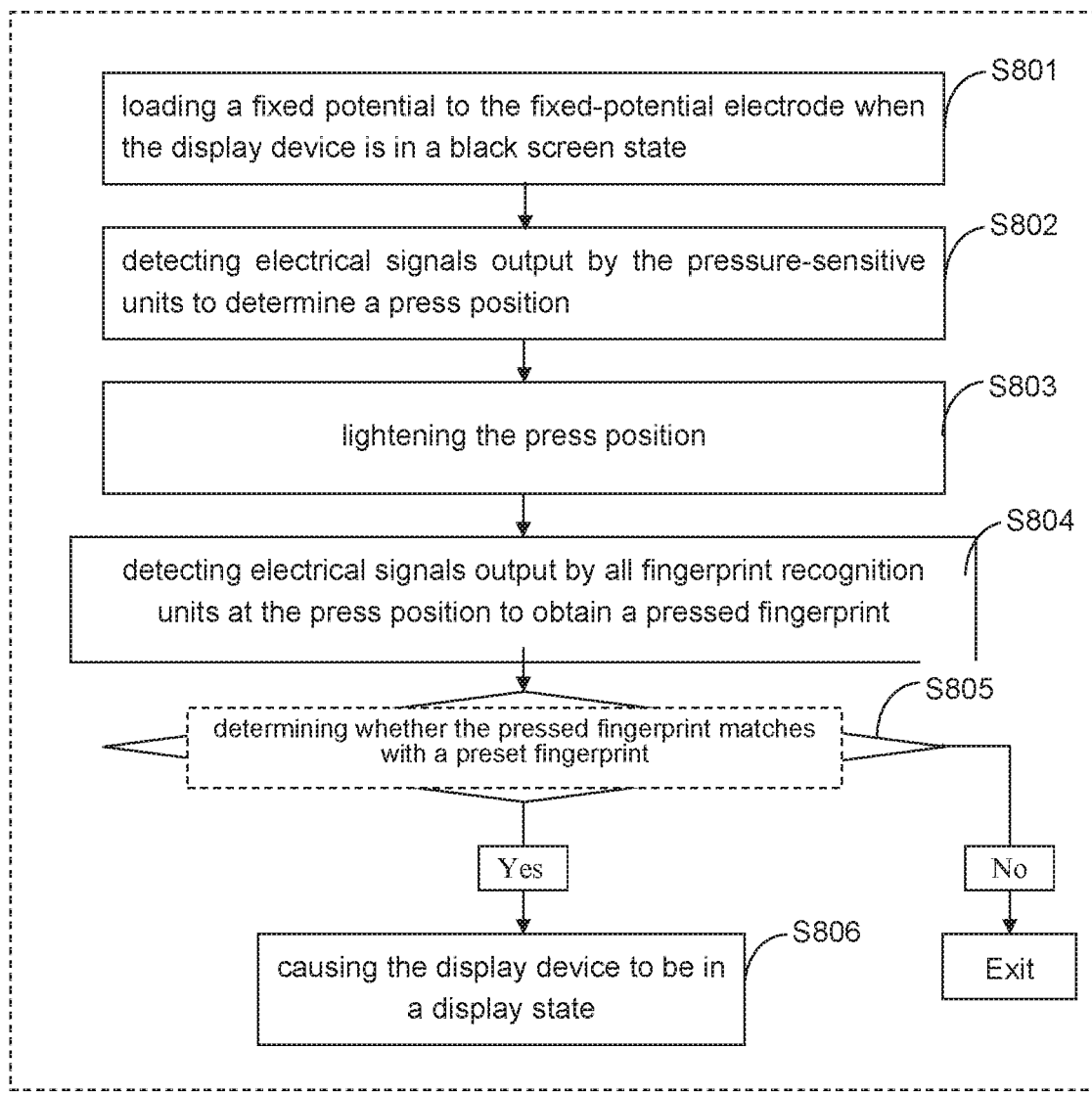

Optionally, in the above driving method provided by the embodiment of the present application, when each photosensitive unit functions as a fingerprint recognition unit, as shown in FIG. 8, which may further include the following steps:

at step S801, when the display device is in a black screen state, loading a fixed potential to the fixed-potential electrode; Specifically, loading a fixed potential to the fixed-potential electrode via a fixed potential signal line Vd;

at step S802, detecting electrical signals output by the pressure-sensitive units to determine a position where the finger pressed;

at step S803, lightening the determined position where the finger pressed; Specifically, the display unit at the position where the finger pressed is notified of lightening, achieving the effect of lightening the position where the finger pressed;

at step S804, detecting electrical signals output by all the fingerprint recognition units at the position where the finger pressed; Specifically, scanning signals may be loaded one by one to the scanning lines SLs that are connected to all the fingerprint recognition units at the position where the finger pressed, and all the read lines RL which are connected to all the fingerprint recognition units at the position where the finger pressed read out current signals output by the light-sensitive diodes via the switching transistors connected to the light-sensitive diodes to determine information of the fingerprint;

at step S805, determining if the pressed fingerprint matches the preset fingerprint; upon determining that the pressed fingerprint matches the preset fingerprint, continuing to step S806; otherwise quitting the process;

at step S806, causing the display device to be in a display state.

Specifically, in the above sensing panel according to the embodiment of the present application, with steps S801 to S806, a fingerprint unlocking function of the display device can be achieved. First the position where the finger pressed is determined by the pressure-sensitive unit in step S802, and then steps S803 and S804 were performed to scan the fingerprint in a local region, which can reduce scanning time and reduce unlocking time.

Figure 9:
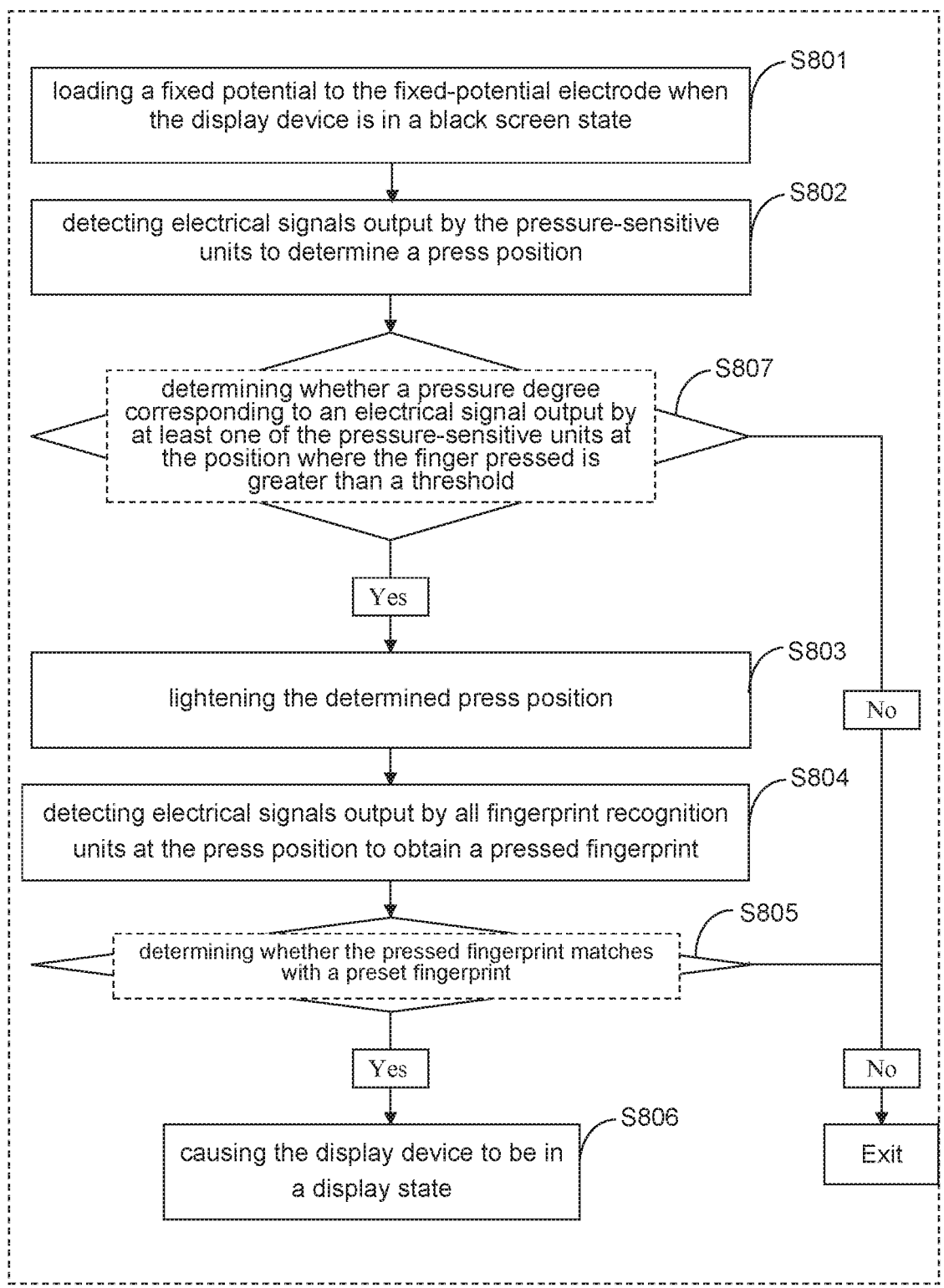

Optionally, in the above driving method provided by the embodiment of the present application, after determining the position where the finger pressed in step S802, as shown in FIG. 9, it may also include the following steps:

at step S807, determining whether a pressure degree corresponding to an electrical signal output by the pressure-sensitive unit at the position where the finger pressed is greater than a threshold; and upon determining that the pressure degree corresponding to the electrical signal is greater than the threshold, performing step S803, that is, lightening the determined position where the finger pressed; otherwise, quitting the process.

Specifically, in the above sensing panel according to the embodiment of the present application, upon determining that the pressure degree reaches the threshold, it indicates a good contact between the finger and the sensing surface, then scanning the fingerprint will be performed; upon determining that the pressure degree does not reach the threshold, it indicates a bad contact between the finger and the sensing surface, in this case even if the fingerprint is detected, the obtained pressed fingerprint will not match the preset fingerprint. Thus, with step S807, the above invalid operation may be avoided.

Optionally, in the above driving method provided by the embodiment of the present application, the plurality of fingerprint recognition units covered by the orthographic projection of one pressure-sensitive unit on the base substrate may constitute one touch recognition unit, which may act as a whole when performing the touch detection; that is, in step S702, detecting electrical signals output by all the photosensitive units to determine a touch position, which may be achieved by the following:

first, resetting all touch recognition units; with the touch recognition units acting as a whole, loading scanning signals to scanning lines SL connected to the touch recognition units, and loading resetting signals of a fixed potential to all read lines RL simultaneously;

then, detecting electrical signals output by all the touch recognition units to determine a touch position; that is, loading scanning signals one by one to the scanning lines SL connected to the touch recognition units, and reading electrical signals output by the light-sensitive diodes by the read lines RL via the switching transistors connecting to the light-sensitive diodes to determine the touch position.

In the sensing panel, the display device and its driving method provided by the above embodiment of the present application, the photosensitive units and the pressure-sensitive units are integrated in the same sensing panel, and are stacked and share the fixed-potential electrode. Thus, after loading a fixed potential to the fixed-potential electrode, the pressure detection and the touch detection can be achieved simultaneously with the same sensing panel. Because this sensing panel may be advantageously integrated into the display device, the pressure detection and the touch detection can be achieved with a high precision and a less change to the display device.

Obviously, those skilled in the art can make various modification and variant to this application without departing from spirit and scope of this application. As such, if these modification and variant of this application fall into the scope of this claim and the equivalence of the application, the present application intends to include these modification and variant.

The invention claimed is:

1. A sensing panel, comprising:
a base substrate;
a plurality of photosensitive units arranged in an array on the base substrate; and
a plurality of pressure-sensitive units arranged in an array on the base substrate;
wherein the plurality of photosensitive units and the plurality of pressure-sensitive units are stacked, and at least one of the plurality of photosensitive units and at least one pressure-sensitive unit of the plurality of pressure-sensitive units, which are stacked, share a fixed-potential electrode, and
wherein each of the at least one pressure-sensitive unit comprises a piezoelectric material layer connected to the fixed-potential electrode and a pressure-sensitive electrode connected to the piezoelectric material layer.

2. The sensing panel as claimed in claim 1, wherein the plurality of pressure-sensitive units are located on a side of the plurality of photosensitive units opposite to the base substrate; and
a region of each of the plurality of pressure-sensitive units which at least overlaps with an orthographic projection of a photosensitive region of one corresponding photosensitive unit on the base substrate is a light transmittance region.

3. The sensing panel as claimed in claim 2, wherein each piezoelectric material layer is independent, and each pressure-sensitive electrode is independent.

4. The sensing panel as claimed in claim 2, wherein each of the plurality of photosensitive units comprises a light-sensitive diode and a switching transistor;
one end of the light-sensitive diode is connected to the fixed-potential electrode and the other end of the light-sensitive diode is connected to a first electrode of the switching transistor; and
a second electrode of the switching transistor is connected to a read line, and a control electrode of the switching transistor is connected to a scan line.

5. The sensing panel as claimed in claim 4, wherein the switching transistor is a bottom-gate transistor; and
each of the plurality of photosensitive units further comprises a metal light blocking layer which is arranged between the bottom-gate transistor and the pressure-sensitive unit, and an orthographic projection of the metal light blocking layer on the base substrate covers at least an orthographic projection of a channel region of the bottom-gate transistor on the base substrate.

6. The sensing panel as claimed in claim 5, wherein the orthographic projection of the metal light blocking layer on the base substrate further covers an orthographic projection of the read line on the base substrate, and the metal light blocking layer is grounded.

7. The sensing panel as claimed in claim 1, wherein each of the plurality of photosensitive units is a fingerprint recognition unit; and
an orthographic projection of one of the plurality of pressure-sensitive units on the base substrate covers orthographic projections of a plurality of fingerprint recognition units, and the plurality of fingerprint recognition units constitute one touch recognition unit.

8. A display device comprising a sensing panel, the sensing panel comprises:
a base substrate;
a plurality of photosensitive units arranged in an array on the base substrate; and
a plurality of pressure-sensitive units arranged in an array on the base substrate;

wherein the plurality of photosensitive units and the plurality of pressure-sensitive units are stacked, and at least one of the plurality of photosensitive units and at least one pressure-sensitive unit of the plurality of pressure-sensitive units, which are stacked, share a fixed-potential electrode, and wherein each of the at least one pressure-sensitive unit comprises a piezoelectric material layer connected to the fixed-potential electrode and a pressure-sensitive electrode connected to the piezoelectric material layer.

9. The display device as claimed in claim 8, further comprising a display panel arranged on the sensing panel.

10. The display device as claimed in claim 9, further comprising a light collimation device arranged between the sensing panel and the display panel.

11. The display device as claimed in claim 8, further comprising a plurality of display units arranged in an array on the base substrate.

12. The display device as claimed in claim 8, wherein the plurality of pressure-sensitive units are located on a side of the plurality of photosensitive units opposite to the base substrate; and
a region of each of the plurality of pressure-sensitive units which at least overlaps with an orthographic projection of a photosensitive region of each of the plurality of photosensitive units on the base substrate is a light transmittance region.

13. The display device as claimed in claim 12, wherein each piezoelectric material layer is independent, and each pressure-sensitive electrode is independent.

14. The display device as claimed in claim 12, wherein each of the plurality of photosensitive units comprises a light-sensitive diode and a switching transistor;
one end of the light-sensitive diode is connected to the fixed-potential electrode and the other end of the light-sensitive diode is connected to a first electrode of the switching transistor; and
a second electrode of the switching transistor is connected to a read line, and a control electrode of the switching transistor is connected to a scan line.

15. The display device as claimed in claim 14, wherein the switching transistor is a bottom-gate transistor; and
each of the plurality of photosensitive units further comprises a metal light blocking layer which is arranged between the bottom-gate transistor and the pressure-sensitive unit, and an orthographic projection of the metal light blocking layer on the base substrate covers at least an orthographic projection of a channel region of the bottom-gate transistor on the base substrate.

16. The display device as claimed in claim 15, wherein the orthographic projection of the metal light blocking layer on the base substrate further covers an orthographic projection of the read line on the base substrate, and the metal light blocking layer is grounded.

17. A driving method for a display device, which comprises a sensing panel, the sensing panel includes:
a base substrate;
a plurality of photosensitive units arranged in an array on the base substrate; and
a plurality of pressure-sensitive units arranged in an array on the base substrate;

wherein the plurality of photosensitive units and the plurality of pressure-sensitive units are stacked, and at least one of the plurality of photosensitive units and at least one pressure-sensitive unit of the plurality of pressure-sensitive units, which are stacked, share a fixed-potential electrode, and wherein each of the at least one pressure-sensitive unit comprises a piezoelectric material layer connected to the fixed-potential electrode and a pressure-sensitive electrode connected to the piezoelectric material layer;

the driving method includes:
loading a fixed potential to the fixed-potential electrode;
detecting first electrical signals output by the plurality of photosensitive units to determine a touch position; and
detecting second electrical signals output by the plurality of pressure-sensitive units to determine a press position.

18. The driving method as claimed in claim 17, when the plurality of photosensitive units act as fingerprint recognition units, the driving method particularly comprises:
loading the fixed potential to the fixed-potential electrode when the display device is in a black screen state;
detecting the second electrical signals output by the plurality of pressure-sensitive units to determine the press position where a finger pressed;
lightening the press position;
detecting the first electrical signals output by the fingerprint recognition units at the press position to obtain a pressed fingerprint, and;
causing the display device to be in a display state upon determining that the pressed fingerprint matches a preset fingerprint.

19. The driving method as claimed in claim 18, after determining the press position, the driving method further comprises:
determining whether a pressure degree corresponding to a second electrical signal output by at least one of the pressure-sensitive units at the press position is greater than a threshold; and
lightening the press position upon determining that the pressure degree corresponding to the electrical signal is greater than the threshold.

20. The driving method as claimed in claim 18, wherein the plurality of fingerprint recognition units covered by an orthographic projection of one of the plurality of pressure-sensitive units on the base substrate constitute one touch recognition unit, and wherein the step of detecting the first electrical signals output by the plurality of photosensitive units to determine a touch position comprises:
resetting each of the plurality of touch recognition units; and
detecting the first electrical signal output by each of the plurality of touch recognition units to determine the touch position.

* * * * *